United States Patent [19]  [11] 4,361,819
Sillard et al.  [45] Nov. 30, 1982

[54] PASSIVE SEMICONDUCTOR POWER LIMITER FORMED ON FLAT STRUCTURE LINES, AND AN ULTRA-HIGH FREQUENCY CIRCUIT USING SUCH A LIMITER

[75] Inventors: Gilles Sillard; Michel Baril, both of Paris, France

[73] Assignee: Thomson-CSF, Paris, France

[21] Appl. No.: 176,100

[22] Filed: Aug. 7, 1980

[30] Foreign Application Priority Data

Aug. 7, 1979 [FR] France ............................. 79 20230

[51] Int. Cl.³ ......................... H01P 1/22; H04B 1/16
[52] U.S. Cl. .................................. 333/109; 333/17 L; 333/247; 455/217; 370/32
[58] Field of Search ...................... 333/17 L, 238, 246, 333/247; 455/325, 327, 330, 80, 82, 217; 370/24, 32

[56] References Cited

U.S. PATENT DOCUMENTS 3,058,070 10/1962 Reingold et al. ............. 333/17 L X
3,772,599 11/1973 Ernst et al. ....................... 333/238 X
3,939,430 2/1976 Dickens et al. ................. 455/327 X

FOREIGN PATENT DOCUMENTS 54-104719 8/1979 Japan .................................. 455/327

Primary Examiner—Paul L. Gensler
Attorney, Agent, or Firm—Oblon, Fisher, Spivak, McClelland & Maier

[57] ABSTRACT

The passive limiter is formed by at least two parallel micro-strip lines, a slot line orthogonal to the two micro-strip lines and a pair of diodes having the same polarity and placed on each edge of the slot line facing one another, the assembly of these three lines and the diodes forming at least two micro-strip line-slot line transitions.

11 Claims, 7 Drawing Figures

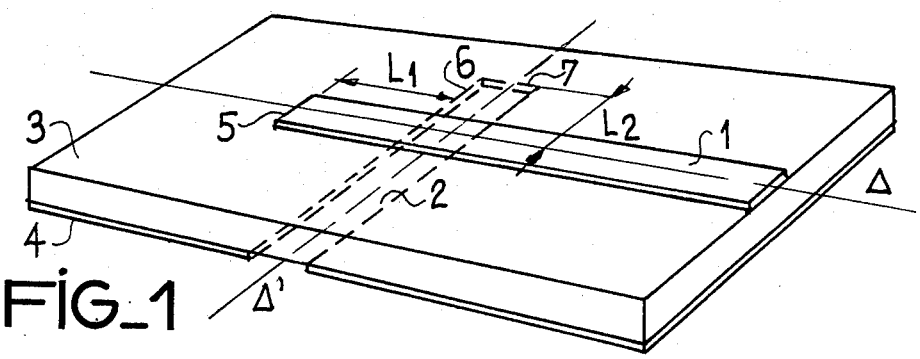
FIG_1
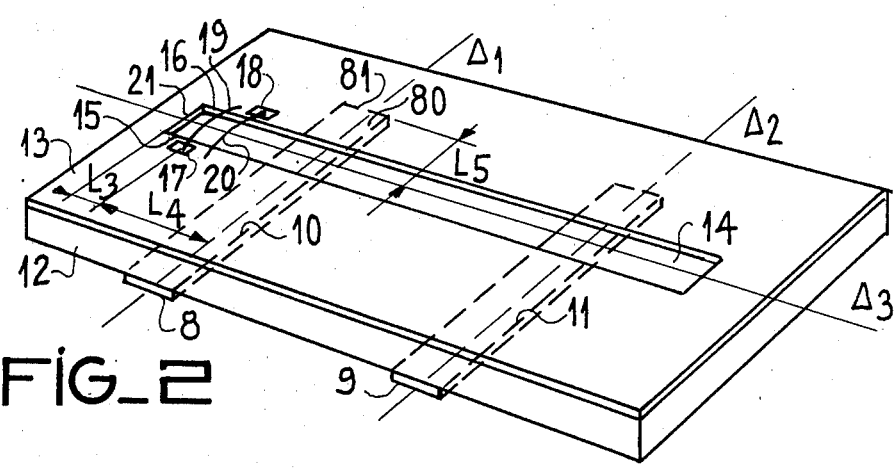
FIG_2
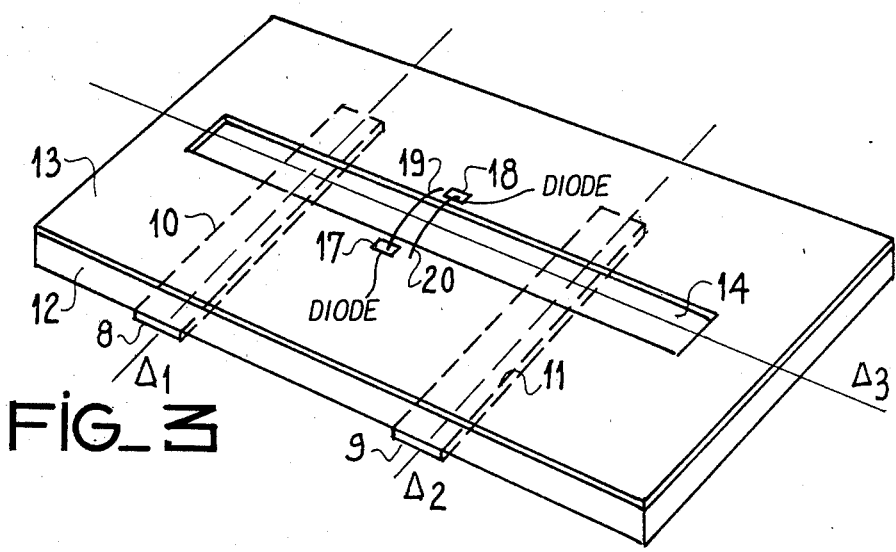
FIG_3

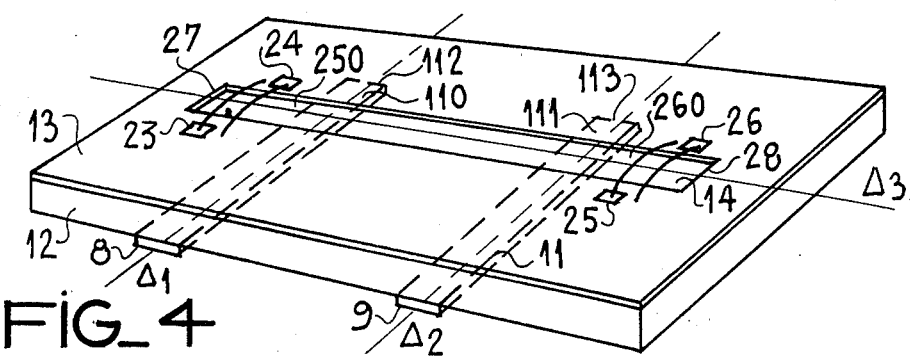
FIG_4
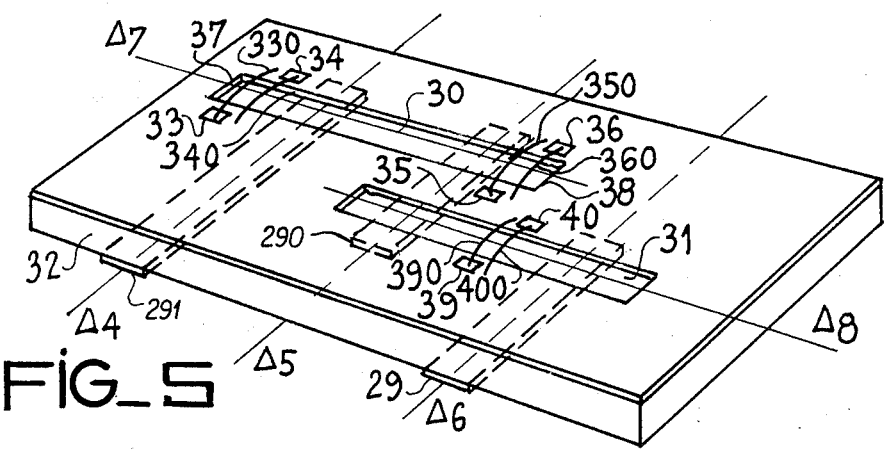
FIG_5
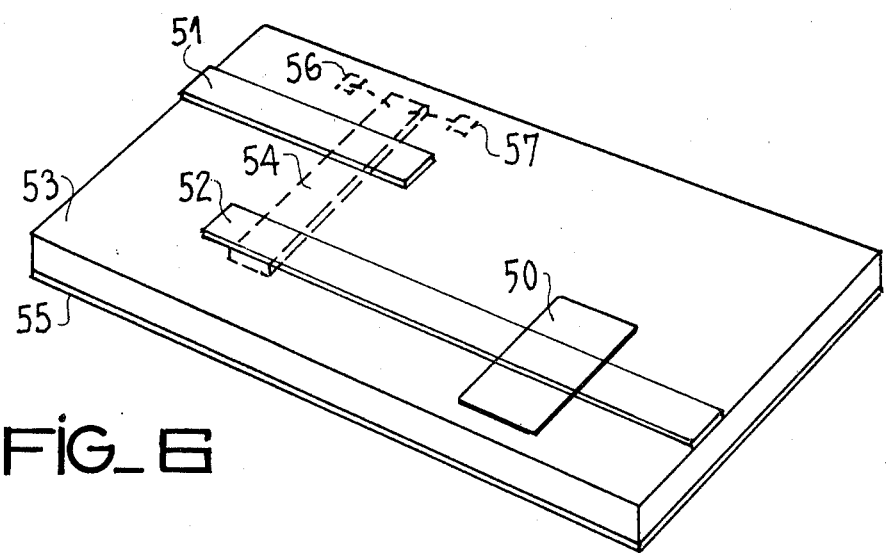
FIG_6

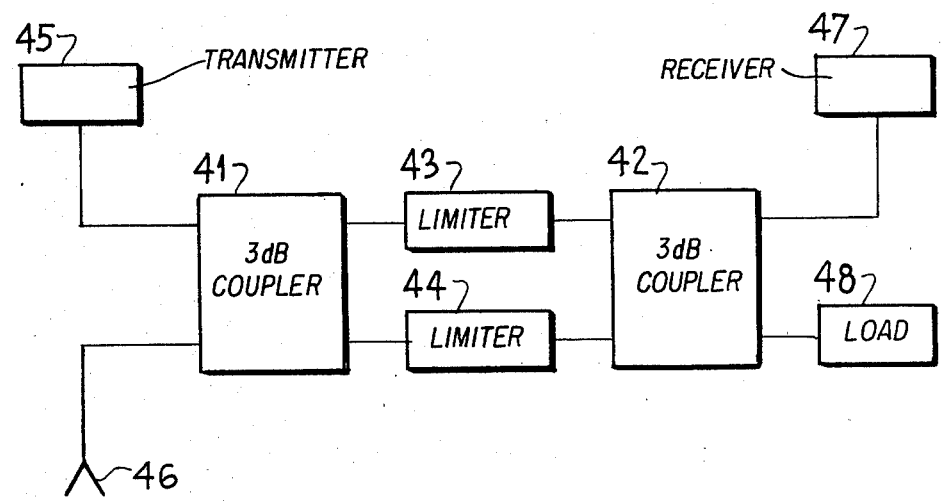
FIG_7

PASSIVE SEMICONDUCTOR POWER LIMITER FORMED ON FLAT STRUCTURE LINES, AND AN ULTRA-HIGH FREQUENCY CIRCUIT USING SUCH A LIMITER

BACKGROUND OF THE INVENTION

The invention relates to a passive semiconductor power limiter, constructed on flat structure lines. The user of such a limiter is particularly advantageous in an ultra-high frequency receiver formed of transistor amplifiers or mixers constructed with micro-strip technology. Limiters in accordance with the invention may also serve for forming duplexers whose role is important in electromagnetic detection equipment or radar.

In the electromagnetic detection equipment or radar to which the present invention more particularly applies, the protection of the receiver of the radar against the transmissions of its own transmitter or of neighboring transmitters has posed a problem to which particular attention has been paid from the outset.

The protection of radar receivers was first of all ensured by gas tubes, called TR tubes which, inserted in the reception chain had the structure of a pass-band filter and the property of being conductive when the ultra-high frequency energy applied was low and reflecting when this energy exceeded a few peak watts. These tubes (which moreover gave satisfaction) presented disadvantages due to a limited life-span and a slight delay on ignition, thus letting through a part of the power towards the receiver which results in damage.

The appearance of P.I.N. diodes enabled in some cases these gas tubes to be replaced by more reliable switches insofar as the life-span was concerned. However, it is necessary to associate with these PIN diodes a control circuit in order to make them conductive a little before transmission by means of an auxiliary biasing source and so as to apply thereto a reverse voltage so as to reduce the losses at the time of reception. These control circuits being synchronous with the radar transmission, the PIN diode switches protect rather well the radar receiver from its own transmitter, but do not protect it however from neighboring transmitters.

Finally, the use of diodes specially designed and associated in pairs has allowed a solid-state protection device to be constructed, which is entirely passive and able to withstand powers of ten or so peak kilowatts. However the construction of this type of limiter on a strip line, requiring the use of two diodes mounted head-to-tail in the same case or on the same support, is very delicate.

Since the use of a passive limiter constructed with a flat structure is particularly advantageous for its integration in a receiver formed of transistor amplifiers or mixers constructed with micro-strip technology for example, the invention aims at remedying the above-mentioned constructional disadvantages.

SUMMARY OF THE INVENTION

According to one feature of the invention, the passive semiconductor power limiter comprises at least two parallel-strip transmission lines with asymmetric electric field configuration, formed by two conducting strips placed on a first face of a dielectric substrate wafer and having parallel propagation axes $\Delta_1$ and $\Delta_2$ and by a mass plane placed on a second face opposite the first, and a transmission line with symmetrical electric field configuration having an axis of propagation $\Delta_3$ perpendicular to said axes $\Delta_1$ and $\Delta_2$ of said asymmetrical lines, placed on the face of the substrate on which is located the mass plane, and at least a pair of diodes, of the same polarity and placed in the same plane on each of the two edges of the symmetrical line, the assembly formed by said transmission lines and diodes forming at least two symmetrical-line-asymmetrical line transitions.

Thus can be formed limiters constituted by one or more pairs of diodes, and ultra-high frequency receivers comprising such limiters.

DESCRIPTION OF THE DRAWINGS

Other characteristics and advantages of the invention will appear from the following description, illustrated by the figures which show:

FIG. 1: a transition between a micro-strip line and a slot line.

FIG. 2: a passive limiter in accordance with the invention.

FIGS. 3 to 6: non-limiting embodiments of a passive limiter in accordance with the invention;

FIG. 7: a duplex using two limiters in accordance with the invention.

DESCRIPTION OF THE PREFERRED EMBODIMENTS

The passive limiter of the invention is designed to withstand high power, of the order of ten or so kilowatts, and is formed in a structure enabling it to be easily integrated in a ceramic micro-strip structure.

A micro-strip transmission line comprises a dielectric substrate wafer, in general made from alumina, on one face of which is deposited a metal plane, called mass plane, and on another face opposite the first there is deposited a metal strip.

Propagation takes place in a mode close to the TEM mode between the metal strip and the mass plane; the configuration of the electric field is said to be asymmetrical.

A slot transmission line is formed by an opening of constant with formed in a metal mass plane, deposited on a dielectric substrate. Propagation takes place in a guided mode between the two parts of the mass plane, the configuration of the electric field is said to be symmetrical.

FIG. 1 shows a transition between a micro-strip line 1 and a slot line 2 formed on the same dielectric substrate wafer 3.

Their respective axes of propagation $\Delta$ and $\Delta'$ are orthogonal. When the distance $L_1$ of the micro-strip line, in open circuit, between one of its ends 5 and the edge 6 of the slot line 2 situated on the same side, is equal to a quarter of a wavelength $\lambda/4$ at the central frequency of the operational band, that causes a short-circuit above the corresponding edge 6. A distance $L_2$ in short-circuit between one of the ends 7 of the slot line 2 and axis $\Delta$ of the micro-strip line, equal to $\lambda/4$, allows propagation in this slot line 2.

FIG. 2 shows a passive limiter in accordance with the invention. It comprises two micro-strip lines 8 and 9, formed by two conducting strips 10 and 11, disposed on a first face of the dielectric substrate wafer 12 and by a mass plane 13 disposed on a second face opposite the first one, and a slot line 14 formed by an opening of constant width formed in the mass plane 13. The microstrip lines 8 and 9 have axes of propagation $\Delta_1$ and $\Delta_2$ which are parallel to each other but orthogonal to the axis of propagation $\Delta_3$ of the slot line 14. A pair of diodes 17 and 18 are placed on a section 15 of the slot line, between one of its ends 21 and axis $\Delta_1$ of the nearest micro-strip line 8 at a distance $L_3$ from the end 21 and at a distance $L_4$ from the axis $\alpha_1$ these distances being measured along axis $\Delta_3$. Diodes 17 and 18 having the same polarity are disposed on each edge 15 and 16 of the slot line 14, symmetrically with respect to axis $\Delta_3$. Each diodes is connected to the opposite edge of the slot line 14 by a connecting wire 19 and 20. To reduce the length of these wires as much as possible, diodes 17 and 18 are placed very close to the edges 15 and 16 of slot line 14. Since propagation in slot line 14 takes place in a guided mode, the mounting thus achieved is head-to-tail.

At a lower power level, diodes 17 and 18 behave like capacitors and the unit that they form with the section of slot line 15 is equivalent to a quarter-wave, $\lambda/4$, section short-circuited at the central frequency of the operating band. The length $L_5$—or dimension along axis $\Delta_1$—of the micro-strip line section 80, between one of the ends 81 of the miro-strip line 8 and axis $\Delta_3$, is equal to $\lambda/4$, so that a micro-strip line-slot line transition is created in the vicinity of the intersection of axes $\Delta_1$ and $\Delta_3$.

The energy being applied by strip line 8 is transmitted into the slot 14, as far as the other slot line 14—micro-strip line 9 transition, formed in accordance with the principle of FIG. 1.

At a higher power level, one of the two diodes 17 or 18 behaves like a short-circuit and mismatches the micro-strip line—slot line transition, thus providing a limitation. Because of the head-to-tail mounting of the two diodes 17 and 18 having the same polarity, mounted in the same plane, one or other of these diodes conducts depending on the polarity of the ultra-high frequency signal, which protects the other diode and ensures good power behavior.

These two diodes 17 and 18 may be mounted with or without a case, the case being able to protect the diode against possible impacts.

FIG. 3 shows another embodiment of the invention, in which the pair of diodes (17 and 18) is situated between the micro-strip line—slot line transitions, formed by the two micro-strip lines 8 and 9 and the slot line 14.

The limiter of the invention allows a greater or lesser limitation to be obtained depending on the position of the diodes along the slot line 14. When the diodes are located between the two micro-strip lines 8 and 9, their coupling is maximum. In this case the limitation is very good and the power behavior is reduced.

In FIG. 4, the limiter of the invention comprises two pairs of diodes (23 and 24) and (25 and 26), placed between the two ends 27 and 28 of the slot line 14 and the two micro-strip lines 8 and 9, so that they form with the two sections 250 and 260 of slot line 14, situated respectively between the two ends (27 and 28) and the axes $\Delta_1$ and $\Delta_2$, short-circuited quarter-wave sections. In order to form two micro-strip line—slot line transitions, the micro-strip line sections 110 and 111 located between the ends 112 and 113 respectively of micro-strip lines 8 and 9 and axis $\Delta_3$, must be equivalent to open-circuit quarter-wavelength sections. The advantage of placing several pairs of diodes at the ends of slot line 14 or between the two micro-strip lines 8 and 9 resides in the fact that the diodes are less coupled for the same limitation, resulting in better power behavior of the limiter.

FIG. 5 shows another embodiment of the invention, which is in no wise limiting. The limiter is formed from several of the above-described assemblies. It comprises three micro-strip lines 291, 290 and 29, having parallel axes of propagation $\Delta_4$, $\Delta_5$ and $\Delta_6$, and two slot lines 30 and 31, having axes of propagation $\Delta_7$ and $\Delta_8$ which are parallel to each other but orthogonal to axes $\Delta_4$, $\Delta_5$ and $\Delta_6$, these propagation lines being formed on a dielectric substrate wafer 32.

Two pairs of diodes (33 and 34) and (35 and 36) are placed on each of the edges of slot line 30 and connected to the other edge by connecting wires (330 and 340) and (350 and 360), between the ends 37 and 38 of slot line 30 and the two micro-strip lines 27 and 28, so that with the micro-strip lines 27 and 28 they form two micro-strip line-slot line transitions as was described above. Another pair of diodes 39 and 40 is placed on the edges of slot line 31, each diode being connected to the edge opposite the one on which it is fixed by means of a connecting wire (390 and 400) between the two axes $\Delta_5$ and $\Delta_6$. The micro-strip lines 28 and 29 are such that with the slot line 31, they form two transitions. The first two pairs of diodes ensure good power behavior and a certain power limitation, which is increased by the third pair of diodes.

Thus has been described a semiconductor limiter constructed on flat structure lines, but it may be formed from several assemblies such as they have been described above.

A particularly advantageous application of this limiter is its integration in a receiver formed of transistor amplifiers or mixers constructed in accordance with micro-strip technology, as shown in FIG. 6. The output of a limiter in accordance with the invention may be coupled directly to the input 50 of an amplifier made from micro-strip lines.

The limiter of FIG. 6 is formed from two micro-strip lines 51 and 52, disposed on a dielectric substrate wafer 53 and a slot line 54 formed in the mass plane 55 of micro-strip lines 51 and 52, these three transmission lines forming transitions thanks to diodes 56 and 57 placed as was described above with reference to FIGS. 2, 3, 4 or 5. The output of the limiter, formed by micro-strip line 52, is coupled to the input 50 of a transistor amplifier.

As was mentioned in the introduction, limiters in accordance with the invention which have just been described may be used in the construction of duplexers whose role is important in electromagnetic detection equipment or radar. The receiver of the radar must be protected both against the high-power transmissions of its own transmitter and against the transmissions of transmitters close to the one concerned.

Generally a duplexer is formed from two identical limiters inserted between two 3 dB couplers. FIG. 7 shows the diagram of a duplexer formed from two 3 dB couplers 41 and 42 and two limiters 43 and 44 in accordance with the invention.

The input of 3 dB coupler 41 is connected, on the one hand, to transmitter 45 and, on the other hand, to the transmitting-receiving antenna 46, whereas its two outputs are connected respectively to the two limiters 43 and 44 of the invention. The output of each limiter is connected to the input of coupler 42 one output of which is connected to receiver 47 and the other output of which is connected to a dissipating load 48. At transmission, the high-power energy emitted by transmitter 45 passes into coupler 41, is reflected on limiters 43 and 44 which play the role of a switch, because the diodes which become equivalent to short-circuits, and is reflected back through coupler 41 to antenna 46. The limiters thus avoid all the power emitted by the transmitter from damaging the receiver. Conversely, at reception, the much lower energy picked up by antenna 46 passes into limiters 43 and 44 which are conducting for the low-level transmitted energy. The energy is then concentrated by coupler 42 before going to receiver 47.

Depending on the transmitting power and on the limitation desired, limiters 43 and 44 are constructed as the different FIGS. 2 to 5 show.

Thus there has been described in what has gone before improvements to passive limiters and to ultra-high frequency circuits comprising such limiters.

What is claimed is:

1. A passive semiconductor power limiter, comprising at least two parallel-strip transmission lines having an asymmetrical electric field configuration, formed by two conducting strips placed on the first face of a dielectric substrate wafer and having parallel axes of propagation and by a single mass plane placed on a second face opposite the first one, at least one transmission line with symmetrical electric field configuration having an axis of propagation perpendicular to the axes of said asymmetrical lines, placed on the face of the substrate on which is situated said mass plane and formed in said mass plane, and at least one pair of diodes of the same polarity and placed in said mass plane, each diode of a pair being disposed on opposite edges of said symmetrical line, each diode having the same electrode connected to said mass plane and having its other electrode directly connected to said same electrode of the other diode so as to form a head-to-tail mounting, the assembly of said transmission lines and diodes forming at least two symmetrical line-asymmetrical line transitions.

2. The passive limiter as claimed in claim 1, wherein said asymmetrical lines are micro-strip lines and said at least one symmetrical line is a slot line.

3. The passive limiter as claimed in claim 2, wherein the diodes are mounted symmetrically with respect to the axis of said slot line and are connected to said mass plane at the other edge of a metal connecting wire.

4. The passive limiter as claimed in claim 3, wherein there are provided two micro-strip transmission lines, a slot transmission line and a pair of diodes placed on the edges of said slot line between the two micro-strip lines where their coupling is maximum, the three transmission lines forming two asymmetrical line-symmetrical line transitions.

5. A passive limiter comprising at least two parallel-strip transmission lines having an asymmetrical electric field configuration, formed by two micro-strip lines placed on the first face of a dielectric substrate wafer and having parallel axes of propagation and by a mass plane placed on a second face opposite the first one, a slot line with symmetrical electric field configuration having an axis of propagation perpendicular to the axes of said asymmetrical lines, placed on the face of the substrate on which is situated said mass plane, and at least one pair of dioes of the same polarity and placed in said mass plane, each diode of a pair being disposed on opposite edges of said slot line, symmetrically with respect to the axis of this line and connected to the other edge by a metal connecting wire, said pair of diodes placed on a section of said slot line between one of its ends and the axis of the nearest micro-strip line, so that said three transmission lines form two symmetrical line-asymmetrical line transitions.

6. The passive limiter as claimed in claim 5, wherein the slot line section comprising said two diodes is equivalent to a short-circuited section of a length equal to a quarter of a wavelength, $\lambda/4$, at the central frequency of the operating band, and wherein an open-circuit section of the micro-strip line located between one of its end and the axis of said slot line has a length equal to $\lambda/4$ at the central frequency of the operating band.

7. A passive limiter comprising at least two parallel-strip transmission lines having an asymmetrical electric field configuration, formed by two micro-strip lines placed on the first face of a dielectric substrate wafer and having parallel axes of propagation and by a mass plane placed on a second face opposite the first one, a slot line with symmetrical electric field configuration having an axis of propagation perpendicular to the axes of said asymmetrical lines, placed on the first of the substrate on which is situated said mass plane, and two pairs of diodes of the same polarity and placed in said mass plane, each diode of a pair being disposed on opposite edges of said slot line, symmetrically with respect to the axis of this line and connected to the other edge by a metal connecting wire, said two pairs of diodes placed respectively on slot line sections located between the two ends of said slot line and the axes of the two micro-strip lines so that these three transmission lines form two symmetrical line-asymmetrical line transitions.

8. The passive limiter as claimed in claim 7, wherein the slot line sections comprising respectively the two pairs of diodes are each equivalent to a short-circuited section of a length equal to a quarter of a wavelength, $\lambda/4$, at the central frequency of the operating band, and wherein the micro-strip line sections, located between the ends respectively of the micro-strip lines and the axis have lengths equal to $\lambda/4$ at the central frequency of the operating band.

9. A passive limiter comprising a plurality of micro-strip lines, formed on a first face of a dielectric substrate wafer, a plurality of slot lines formed in a mass plane on a second face of said dielectric substrate wafer and a plurality of pairs of diodes, each diode of a pair being disposed on opposite edges of a slot line, the propagation axes of the micro-strip lines being parallel to each other and orthogonal to the axes of propagation of said slot lines which are also parallel to each other, and said transmission lines forming several symmetrical line-asymmetrical line transitions.

10. An ultra-high frequency receiver comprising at least a transistor amplifier, the input of said amplifier being directly coupled to a microstrip line, said line also constituting the output of a passive limiter said passive limiter comprising at least two parallel-strip transmission lines having an asymmetrical electric field configuration, formed by two conducting strips placed on the first face of a dielectric substrate wafer and having parallel axes of propagation and by one mass plane placed on a second face opposite the first one, at least one transmission line with symmetrical electric field configuration having an axis of propagation perpendicular to the axes of said asymmetrical lines, placed on the face of the substrate on which is situated said mass plane and formed in said mass plane, and at least one pair of diodes of the same polarity and placed in said mass plane, each diode of a pair being disposed on opposite edges of said symmetrical line, each diode having the same electrode connected to said mass plane and having its other electrode directly connected to said same electrode of the other diode so as to form a head-to-tail mounting, the assembly of said transmission lines and diodes forming at least two symmetrical line-asymmetrical line transitions.

11. An ultra-high frequency duplexer in a radar device comprising two 3 dB couplers (41 and 42), the first coupler (41) having its inputs connected on the one hand to a transmitter (45) and, on the other hand to a transmitting-receiving antenna (46) and the second coupler (42) having its outputs connected on the one hand, to a receiver (47) and, on the other hand, to a dissipating load (48), the outputs of said first coupler (41) being connected to the inputs of said second coupler (42) through two passive limiters (43 and 44), each of said passive limiters comprising at least two parallel-strip transmission lines have an asymmetrical electric field configuration, formed by two conducting strips placed on the first face of a dielectric substrate wafer and having parallel axes of propagation and by one mass plane placed on a second face opposite the first one, at least one transmission line with symmetrical electric field configuration having an axis of propagation perpendicular to the axes of said asymmetrical lines, placed on the face of the substrate on which is situated said mass plane and formed in said mass plane, and at least one pair of diodes of the same polarity and placed in the said mass plane, each diode of a pair being disposed on opposite edges of said symmetrical line, each diode having the same electrode connected to said mass plane and having its other electrode directly connected to said same electrode of the other diode so as to form a head-to-tail mounting, the assembly of said transmission lines and diodes forming at least two symmetrical line-asymmetrical line transitions.

* * * * *